United States Patent
Nakanishi et al.

(10) Patent No.: US 12,132,254 B2
(45) Date of Patent: Oct. 29, 2024

(54) IMPEDANCE MATCHING FILM FOR RADIO WAVE ABSORBER, IMPEDANCE MATCHING FILM-ATTACHED FILM FOR RADIO WAVE ABSORBER, RADIO WAVE ABSORBER, AND LAMINATE FOR RADIO WAVE ABSORBER

(71) Applicant: NITTO DENKO CORPORATION, Ibaraki (JP)

(72) Inventors: Yosuke Nakanishi, Osaka (JP); Hironobu Machinaga, Osaka (JP); Sho Shibahara, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 485 days.

(21) Appl. No.: 17/599,327

(22) PCT Filed: Mar. 27, 2020

(86) PCT No.: PCT/JP2020/014414
§ 371 (c)(1),
(2) Date: Sep. 28, 2021

(87) PCT Pub. No.: WO2020/203942
PCT Pub. Date: Oct. 8, 2020

(65) Prior Publication Data
US 2022/0190483 A1    Jun. 16, 2022

(30) Foreign Application Priority Data
Mar. 29, 2019    (JP) ................... 2019-067027

(51) Int. Cl.
*H01Q 17/00* (2006.01)
*B32B 7/02* (2019.01)
(Continued)

(52) U.S. Cl.
CPC ........... *H01Q 17/007* (2013.01); *B32B 7/025* (2019.01); *B32B 15/08* (2013.01); *B32B 2250/04* (2013.01);
(Continued)

(58) Field of Classification Search
CPC .. H01Q 17/007; B32B 7/025; B32B 2250/04; B32B 2255/10; B32B 2255/205;
(Continued)

(56) References Cited

U.S. PATENT DOCUMENTS 5,243,320 A     9/1993  Clouser et al.
2016/0160345 A1* 6/2016 Miyamoto ............... B32B 9/00
                                                    428/480

(Continued)

FOREIGN PATENT DOCUMENTS

CN    1073547 A      6/1993
JP    2006-120836 A  5/2006
(Continued)

OTHER PUBLICATIONS

Uozumi, JP 2006323567 A (Year: 2006).*
(Continued)

*Primary Examiner* — Timothy A Brainard
*Assistant Examiner* — Helena H Seraydaryan
(74) *Attorney, Agent, or Firm* — WHDA, LLP

(57) ABSTRACT

An impedance matching film 10 includes a metallic element and a non-metallic element. The impedance matching film 10 has a thickness of 10 to 200 nm. The impedance matching film 10 has a sheet resistance of 200 Ω/□ or more. In the impedance matching film 10, the content of an oxygen atom is less than 50% in terms of the number of atoms.

9 Claims, 3 Drawing Sheets

(51) Int. Cl.
*B32B 7/025* (2019.01)
*B32B 15/08* (2006.01)

(52) U.S. Cl.
CPC ..... *B32B 2255/10* (2013.01); *B32B 2255/205* (2013.01); *B32B 2307/202* (2013.01); *B32B 2307/204* (2013.01); *B32B 2307/732* (2013.01); *B32B 2457/00* (2013.01)

(58) Field of Classification Search
CPC ........ B32B 2307/202; B32B 2307/204; B32B 2307/732
See application file for complete search history.

(56) References Cited

U.S. PATENT DOCUMENTS

| 2020/0214181 A1 | 7/2020 | Yamagata et al. |
| 2021/0010107 A1 | 1/2021 | Nakao et al. |

FOREIGN PATENT DOCUMENTS

| JP | 2018-56562 A | 4/2018 |
| JP | 2018-098367 A | 6/2018 |
| WO | 2018/230092 A1 | 12/2018 |
| WO | 2019-182002 A1 | 9/2019 |

OTHER PUBLICATIONS

International Search Report dated Jun. 23, 2020, issued in counterpart International Application No. PCT/JP2020/014414. (2 pages).
Written Opinion of the International Searching Authority (Form PCT/ISA/237) dated Jun. 23, 2020, issued in counterpart International Application No. PCT/JP2020/014414, with English Translation. (7 pages).
Office Action dated May 14, 2024, issued in counterpart JP application No. 2020-059170, with English translation. (9 pages).
Office Action dated Jan. 4, 2024, issued in counterpart CN Application No. 202080021394.2, with English translation. (11 pages).

* cited by examiner

IMPEDANCE MATCHING FILM FOR RADIO WAVE ABSORBER, IMPEDANCE MATCHING FILM-ATTACHED FILM FOR RADIO WAVE ABSORBER, RADIO WAVE ABSORBER, AND LAMINATE FOR RADIO WAVE ABSORBER

TECHNICAL FIELD

The present invention relates to an impedance matching film for a radio wave absorber, an impedance matching film-attached film for a radio wave absorber, a radio wave absorber, and a laminate for a radio wave absorber.

BACKGROUND ART

An impedance matching technique has been conventionally known in which an impedance of a surface of a radio wave absorber is matched to a characteristic impedance of air by means of an alloy forming a resistive film for a radio wave absorber.

For example, Patent Literature 1 proposes a resistive film for a λ/4 radio wave absorber, the resistive film being made of an alloy including 5 weight % or more of molybdenum. In this resistive film for a λ/4 radio wave absorber, the surface resistance value is adjusted in a given range at a film thickness of 5 to 6 nm by adjusting the content of nickel and that of chromium in the alloy.

CITATION LIST

Patent Literature

Patent Literature 1: JP 2018-056562 A

SUMMARY OF INVENTION

Technical Problem

In Patent Literature 1, a time-dependent change in the surface resistance of the resistive film is measured at 25° C. However, a time-dependent change in the surface resistance of the resistive film exposed to a high-temperature environment (for example, an environment of 80° C.) is not evaluated in Patent Literature 1.

In view of such circumstances, the present invention provides a new impedance matching film for a radio wave absorber, the new impedance matching film being advantageous in that a change in sheet resistance is suppressed in terms of impedance matching when the new impedance matching film is exposed to a high-temperature environment.

Solution to Problem

The present invention provides an impedance matching film for a radio wave absorber, including:
 a metallic element; and
 a non-metallic element, wherein
 the impedance matching film has a thickness of 10 to 200 nm,
 the impedance matching film has a sheet resistance of 200 Ω/□ or more, and
 a content of an oxygen atom is less than 50% in terms of the number of atoms.

The present invention also provides an impedance matching film-attached film for a radio wave absorber, including:
 a substrate; and
 the above impedance matching film for a radio wave absorber.

The present invention also provides a radio wave absorber, including:
 the above impedance matching film for a radio wave absorber;
 an electrical conductor that reflects a radio wave; and
 a dielectric layer disposed between the impedance matching film and the electrical conductor in a thickness direction of the impedance matching film.

The present invention also provides a laminate for a radio wave absorber, including:
 the above impedance matching film for a radio wave absorber; and
 a dielectric layer disposed in contact with the impedance matching film in a thickness direction of the impedance matching film.

Advantageous Effects of Invention

The above impedance matching film for a radio wave absorber is advantageous in that a change in sheet resistance is suppressed in terms of impedance matching when the impedance matching film is exposed to a high-temperature environment.

DESCRIPTION OF EMBODIMENTS

Hereinafter, embodiments of the present invention will be described with reference to the drawings. The present invention is not limited to the following embodiments.

Figure 1:
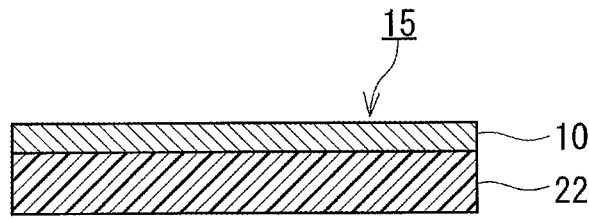
FIG. 1 is a cross-sectional view showing an example of an impedance matching film for a radio wave absorber according to the present invention.

As shown in FIG. 1, an impedance matching film 10 for a radio wave absorber is provided, for example, in the form of an impedance matching film-attached film 15 for a radio wave absorber. The impedance matching film 10 for a radio wave absorber is a resistive film. The impedance matching film-attached film 15 for a radio wave absorber includes a substrate 22 and the impedance matching film 10 for a radio wave absorber. The impedance matching film 10 for a radio wave absorber is formed, for example, on one principal surface of the substrate 22.

The impedance matching film 10 includes a metallic element and a non-metallic element. Besides, the impedance matching film 10 has a thickness of 10 to 200 nm and a sheet resistance of 200 Ω/☐ or more. Additionally, in the impedance matching film 10, a content of an oxygen atom is less than 50% in terms of the number of atoms. Hence, the impedance matching film 10 does not include an indium tin oxide (ITO) film. Herein, metalloid elements such as silicon, germanium, arsenic, antimony, and tellurium are treated as non-metallic elements. The impedance matching film 10 is, for example, a resistive film adjusted so that an impedance expected on its front surface will be equal to a characteristic impedance of a plane wave.

The impedance matching film 10, which has a thickness of 10 to 200 nm, easily maintains the sheet resistance desirable in terms of impedance matching when exposed to a high-temperature environment (for example, 80° C.). This is because, in the case where the vicinity of a surface of the impedance matching film deteriorates in a high-temperature environment, the deteriorated portion occupies a small voluminal proportion in the impedance matching film 10. On the other hand, the resistive film, described in Patent Literature 1, for a λ/4 radio wave absorber has a thickness of, for example, 5 to 6 nm. Because of this thin resistive film, in the case where the vicinity of a surface of the resistive film deteriorates in a high-temperature environment, the deteriorated portion occupies a large voluminal proportion in the resistive film and greatly affects properties of the resistive film for impedance matching. Therefore, it is difficult to say that the technique described in Patent Literature 1 is advantageous in that a change in the sheet resistance of the resistive film is suppressed in terms of impedance matching when the resistive film is exposed to a high-temperature environment.

The thickness of the impedance matching film 10 may be 11 nm or more, 13 nm or more, or 15 nm or more.

The impedance matching film 10 has a thickness of 200 nm or less. Because of this, warping of the impedance matching film 10 can be reduced, and cracking is less likely to occur in the impedance matching film 10. The thickness of the impedance matching film 10 may be 180 nm or less, 160 nm or less, or 150 nm or less.

Since the impedance matching film 10 has a sheet resistance of 200 Ω/☐ or more, a radio wave absorber produced using the impedance matching film 10 is likely to exhibit desired radio wave absorption performance.

The impedance matching film 10 may have a sheet resistance of 220 Ω/☐ or more, 250 Ω/☐ or more, or 280 Ω/☐ or more.

The upper limit of the specific resistance of the impedance matching film 10 is not limited to a particular value. The specific resistance of the impedance matching film 10 can be adjusted considering characteristics of other components of a radio wave absorber. In an exemplary radio wave absorber, the specific resistance of the impedance matching film 10 is, for example, $8.0 \times 10^3$ Ω·cm or less. The specific resistance of the impedance matching film 10 may be $7.7 \times 10^{-3}$ Ω·cm or less, $7.3 \times 10^{-3}$ Ω·cm or less, or $7 \times 10^{-3}$ Ω·cm or less. For example, when the radio wave absorber does not include a loss material such as a dielectric loss material or a magnetic loss material, the upper limit of the specific resistance of the impedance matching film 10 can be adjusted in the above range. In another exemplary radio wave absorber, the specific resistance of the impedance matching film 10 is, for example, 150 Ω·cm or less, and may be 100 Ω·cm or less, 80 Ω·cm or less, or 50 Ω·cm or less. For example, when the radio wave absorber includes a loss material such as a dielectric loss material or a magnetic loss material, the upper limit of the specific resistance of the impedance matching film 10 can be adjusted in the above range.

The impedance matching film 10 has a specific resistance of, for example, $0.40 \times 10^{-3}$ Ω·cm or more. This makes it easy for the impedance matching film 10 to have a thickness of 10 to 200 nm and the sheet resistance desirable in terms of impedance matching.

The impedance matching film 10 may have a specific resistance of $0.44 \times 10^{-3}$ Ω·cm or more, $0.50 \times 10^{-3}$ Ω·cm or more, or $0.56 \times 10^{-3}$ Ω·cm or more.

The upper limit of the specific resistance of the impedance matching film 10 is not limited to a particular value. The specific resistance of the impedance matching film 10 can be adjusted considering characteristics of other components of a radio wave absorber. In an exemplary radio wave absorber, the specific resistance of the impedance matching film 10 is, for example, $8.0 \times 10^{-3}$ Ω·cm or less. The specific resistance of the impedance matching film 10 may be $7.7 \times 10^{-3}$ Ω·cm or less, $7.3 \times 10^{-3}$ Ω·cm or less, or $7 \times 10^{-3}$ Ω·cm or less. For example, when the radio wave absorber does not include a loss material such as a dielectric loss material or a magnetic loss material, the upper limit of the sheet resistance of the impedance matching film 10 can be adjusted in the above range. In another exemplary radio wave absorber, the specific resistance of the impedance matching film 10 is, for example, 150 Ω·cm or less, and may be 100 Ω·cm or less, 80 Ω·cm or less, or 50 Ω·cm or less. For example, when the radio wave absorber includes a loss material such as a dielectric loss material or a magnetic loss material, the upper limit of the sheet resistance of the impedance matching film 10 can be adjusted in the above range.

A sheet resistance change rate Cs determined for the impedance matching film 10 by the following equation (1) is, for example, 30% or less. In the equation (1), Ri [Ω/☐] refers to an initial sheet resistance of the impedance matching film 10, and Rt [Ω/☐] refers to a sheet resistance of the impedance matching film 10 having been held at an environmental temperature of 80° C. for 24 hours. With the impedance matching film 10 having a sheet resistance change rate Cs of 30% or less, a radio wave absorber easily maintains its radio wave absorption performance when exposed to a high-temperature environment. The sheet resistance change rate Cs is most desirably 0%.

$$Cs[\%] = 100 \times |Rt - Ri|/Ri \qquad \text{Equation (1)}$$

The sheet resistance change rate Cs of the impedance matching film 10 may be 28% or less, 25% or less, or 23% or less.

The non-metallic element included in the impedance matching film 10 is not limited to a particular element as long as the impedance matching film 10 has a thickness of 10 to 200 nm and having a sheet resistance of 200 Ω/☐ or more. The non-metallic element included in the impedance matching film 10 is at least one element selected from the group consisting of, for example, B, C, N, O, F, Si, S, and Ge. In this case, it is ensured that the impedance matching film 10 easily maintains the sheet resistance desirable in terms of impedance matching when exposed to a high-temperature environment.

The metallic element included in the impedance matching film 10 is not limited to a particular element as long as the impedance matching film 10 has a thickness of 10 to 200 nm and having a sheet resistance of 200 Ω/☐ or more. The metallic element included in the impedance matching film 10 is at least one element selected from the group consisting of, for example, Ni, Cr, Ti, W, Mo, Cu, Al, Sn, Pd, Ta, Rh, Au, Mg, Fe, Mn, Co, and V. In this case, it is ensured that the impedance matching film 10 easily maintains the sheet resistance desirable in terms of impedance matching when exposed to a high-temperature environment.

The metallic element included in the impedance matching film 10 may be at least one element selected from the group consisting of Ni, Cr, Mo, and Ti. In this case, it is ensured that the impedance matching film 10 easily maintains the sheet resistance desirable in terms of impedance matching when exposed to a high-temperature environment.

The content of the metallic element included in the impedance matching film 10 in terms of the number of atoms is not limited to a particular value. The content thereof is more than 0%, and may be 5% or more, 10% or more, 15% or more, or 20% or more. The content of the metallic element included in the impedance matching film 10 in terms of the number of atoms is, for example, 90% or less, and may be 85% or less, 80% or less, 75% or less, or 70% or less.

When the metallic element included in the impedance matching film 10 includes at least one element selected from the group consisting of Ni, Cr, Mo, and Ti, the total content of Ni, Cr, Mo, and Ti in terms of the number of atoms is, for example, 10% or more. In this case, it is ensured that the impedance matching film 10 easily maintains the sheet resistance desirable in terms of impedance matching when exposed to a high-temperature environment.

In the impedance matching film 10, the total content of Ni, Cr, Mo, and Ti in terms of the number of atoms may be 11% or more, 13% or more, or 15% or more. In the impedance matching film 10, the total content of Ni, Cr, Mo, and Ti in terms of the number of atoms is, for example, 90% or less, and may be 85% or less, 80% or less, 75% or less, or 70% or less.

The substrate 22 plays a role, for example, as a support that supports the impedance matching film 10. The impedance matching film 10 is formed, for example, on one principal surface of the substrate 22 by sputtering using a given target material. In this case, for example, a given target material including the metallic element and the non-metallic element is used. The impedance matching film 10 can be formed to have an oxygen atom content of less than 50% in terms of the number of atoms by adjusting given conditions, such as the ratio of the volumetric flow rate of an active gas such as oxygen gas to the volumetric flow rate of gas supplied around the substrate 22 in sputtering, as well as the composition of the target material. The impedance matching film 10 may be formed by a method such as ion plating or coating (for example, bar coating) in some cases.

Figure 2A:
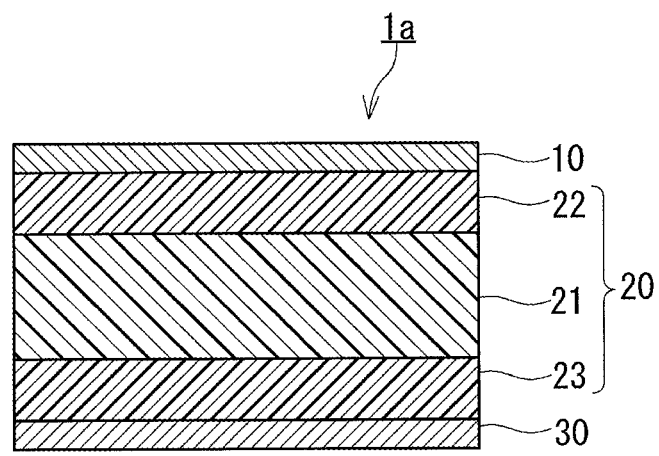
FIG. 2A is a cross-sectional view showing an example of a radio wave absorber according to the present invention.

As shown in FIG. 2A, a radio wave absorber 1a can be provided using the impedance matching film 10. The radio wave absorber 1a includes the impedance matching film 10, an electrical conductor 30, and a dielectric layer 20. The electrical conductor 30 reflects a radio wave. The dielectric layer 20 is disposed, for example, between the impedance matching film 10 and the electrical conductor 30 in a thickness direction of the impedance matching film 10.

The radio wave absorber 1a is, for example, a λ/4 radio wave absorber. The radio wave absorber 1a is designed to cause interference between a radio wave reflected by the surface of the impedance matching film 10 (front surface reflection) and a radio wave reflected by the electrical conductor 30 (back surface reflection) upon incidence of a radio wave having a wavelength ($\lambda_O$) to be absorbed on the radio wave absorber 1a. For the λ/4 radio wave absorber, the wavelength $\lambda_O$ of a radio wave to be absorbed is determined according to the thickness t of the dielectric layer and the relative permittivity $\epsilon_r$ of the dielectric layer, as shown in the following equation (2). That is, a radio wave having a wavelength to be absorbed can be set by appropriately adjusting the relative permittivity and thickness of the dielectric layer. In the equation (2), sqrt($\epsilon_r$) means a square root of the relative permittivity $\epsilon_r$.

$$\lambda_O = 4t \times sqrt(\epsilon_r) \quad \text{Equation (2)}$$

Since the radio wave absorber 1a includes the impedance matching film 10 as described above, the radio wave absorber 1a easily maintains desired radio wave absorption performance when exposed to a high-temperature environment.

In designing the radio wave absorber, for example, the sheet resistance of the impedance matching film 10 is determined so that an impedance expected on a front surface of the impedance matching film 10 will be equal to a characteristic impedance of a plane wave based on the transmission-line theory. In the radio wave absorber, the sheet resistance required of the impedance matching film 10 can change according to a possible incident angle at which a radio wave is incident on the radio wave absorber.

The electrical conductor 30 is not particularly limited as long as the electrical conductor 30 can reflect a radio wave to be absorbed. The electrical conductor 30 has a given electrical conductivity. As shown in FIG. 2A, the electrical conductor 30 is formed, for example, in the form of a layer. In this case, the electrical conductor 30 has a lower sheet resistance than that of the impedance matching film 10. The electrical conductor 30 may be in a form other than a layer.

The electrical conductor 30 includes, for example, indium tin oxide. In this case, the electrical conductor 30 is likely to have high transparency.

The content of tin oxide in the indium tin oxide in the electrical conductor 30 is, for example, 5 to 15 mass %. In this case, the electrical conductor 30 can be formed of indium tin oxide in a stable polycrystalline state by annealing treatment. This ensures that the radio wave absorber 1a easily exhibits desired radio wave absorption performance when exposed to a high-temperature environment for a long period of time.

The electrical conductor 30 may include at least one selected from the group consisting of aluminum, copper, iron, an aluminum alloy, a copper alloy, and an iron alloy. In this case, a desired electrical conductivity is likely to be achieved while the thickness of the electrical conductor 30 is reduced.

The thickness of the electrical conductor 30 is not limited to a particular thickness. For example, when the electrical conductor 30 is formed of the indium tin oxide, the electrical conductor 30 has a thickness of, for example, 20 to 200 nm and desirably 50 to 150 nm. In this case, the radio wave absorber 1a can exhibit desired radio wave absorption performance, and cracking is less likely to occur in the electrical conductor 30.

When the electrical conductor 30 is at least one selected from the group consisting of aluminum, copper, iron, an aluminum alloy, a copper alloy, and an iron alloy, the electrical conductor 30 has a thickness of, for example, 30 nm to 100 μm and desirably 50 nm to 50 μm.

The relative permittivity of the dielectric layer 20 is, for example, 2.0 to 20.0. In this case, the thickness of the dielectric layer 20 is easily adjusted and the radio wave absorption performance of the radio wave absorber 1a is easily adjusted. The relative permittivity of the dielectric layer 20 is, for example, a relative permittivity measured at 10 GHz by a cavity resonance method.

The dielectric layer 20 is formed of, for example, a given polymer. The dielectric layer 20 includes, for example, at least one polymer selected from the group consisting of ethylene-vinyl acetate copolymer, vinyl chloride resin, urethane resin, acrylic resin, acrylic urethane resin, polyethylene, polypropylene, silicone, polyethylene terephthalate, polyethylene naphthalate, polycarbonate, polyimide, and cycloolefin polymer. In this case, the thickness of the dielectric layer 20 is easily adjusted and the manufacturing cost of the radio wave absorber 1a can be kept at a low level. The dielectric layer 20 can be produced, for example, by hot-pressing a given resin composition.

The dielectric layer 20 may be formed as a single layer or as a plurality of layers made of the same material or different materials. When the dielectric layer 20 includes n layers (n is an integer of 2 or greater), the relative permittivity of the dielectric layer 20 is determined, for example, as follows. The relative permittivity $\epsilon_i$ of each layer is measured (i is an integer of 1 to n). Next, the relative permittivity $\epsilon_i$ of each layer is multiplied by the proportion of the thickness $t_i$ of the layer in the total thickness T of the dielectric layer 20 to determine $\epsilon_i \times (t_i/T)$. The relative permittivity of the dielectric layer 20 can be determined by adding the $\epsilon_i \times (t_i/T)$ values of all layers.

As shown in FIG. 2A, the dielectric layer 20 includes, for example, a first layer 21, a second layer 22, and a third layer 23. The first layer 21 is disposed between the second layer 22 and the third layer 23. The first layer 21 includes, for example, at least one polymer selected from the group consisting of ethylene-vinyl acetate copolymer, vinyl chloride resin, urethane resin, acrylic resin, acrylic urethane resin, polyethylene, polypropylene, silicone, polyethylene terephthalate, polyethylene naphthalate, polycarbonate, polyimide, and cycloolefin polymer.

Figure 2B:
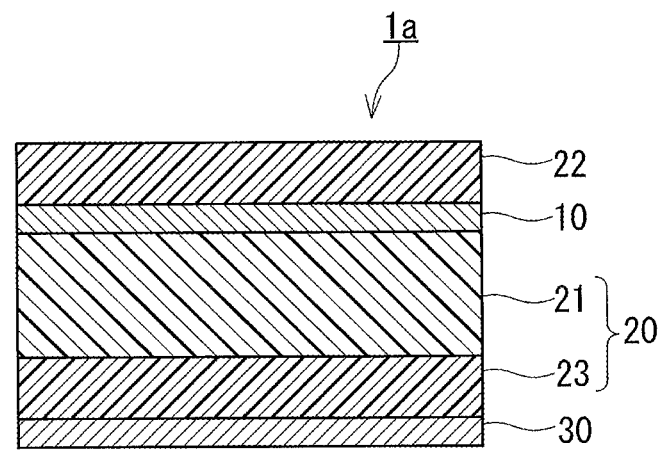
FIG. 2B is a cross-sectional view showing a variation of the radio wave absorber shown in FIG. 2A.

In the radio wave absorber 1a, the second layer 22 doubles as a substrate for the impedance matching film 10. The second layer 22 is, for example, disposed closer to the electrical conductor 30 than the impedance matching film 10 is. As shown in FIG. 2B, the second layer 22 may be disposed farther from the electrical conductor 30 than the impedance matching film 10 is. In this case, the dielectric layer 20 is composed of the first layer 21 and the third layer 23. In this case, the second layer 22 protects the impedance matching film 10 and the dielectric layer 20, and the radio wave absorber 1a has high durability. In this case, for example, the impedance matching film 10 may be in contact with the first layer 21. The second layer 22, for example, also plays a role as an auxiliary member for adjusting the thickness of the impedance matching film 10 with high accuracy. The material of the second layer 22 is, for example, polyethylene terephthalate (PET), polyethylene naphthalate (PEN), acrylic resin (PMMA), polycarbonate (PC), polyimide (PI), or cycloolefin polymer (COP). Among these, the material of the second layer 22 is desirably PET in terms of the balance among good heat-resistance, dimensional stability, and manufacturing cost.

The substrate 22 has a thickness of, for example, 10 to 150 μm and desirably 15 to 100 μm. In this case, the substrate 22 has low flexural rigidity, and occurrence of a wrinkle in the substrate 22 or deformation of the substrate 22 can be reduced at the time of formation of the impedance matching film 10.

Figure 2C:
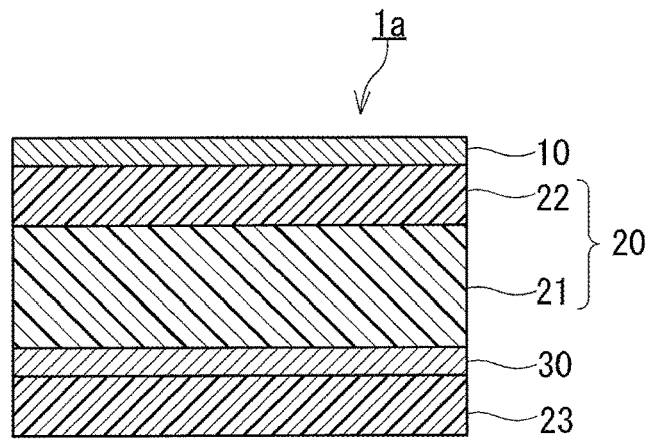
FIG. 2C is a cross-sectional view showing another variation of the radio wave absorber shown in FIG. 2A.

In the radio wave absorber 1a, the third layer 23 supports, for example, the electrical conductor 30 in the form of a layer. In this case, the electrical conductor 30 in the form of a layer is, for example, a metallic foil or an alloy foil. The electrical conductor 30 in the form of a layer may be produced, for example, by forming a film on the third layer 23 by a method such as sputtering, ion plating, or coating (for example, bar coating). In the radio wave absorber 1a, for example, the third layer 23 is disposed closer to the impedance matching film 10 than the electrical conductor 30 in the form of a layer is and constitutes a portion of the dielectric layer 20. As shown in FIG. 2C, the third layer 23 may be disposed farther from the impedance matching film 10 than the electrical conductor 30 in the form of a layer is. In this case, for example, the electrical conductor 30 in the form of a layer is in contact with the first layer 21.

The examples of the material of the second layer 22, for example, can be used as the material of the third layer 23. The material of the third layer 23 may be the same as or different from the material of the second layer 22. The material of the third layer 23 is desirably PET in terms of the balance among good heat-resistance, dimensional stability, and manufacturing cost.

The third layer 23 has a thickness of, for example, 10 to 150 μm and desirably 15 to 100 μm. In this case, the third layer 23 has low flexural rigidity, and occurrence of a wrinkle in the third layer 23 or deformation of the third layer 23 can be reduced at the time of formation of the electrical conductor 30 in the form of a layer. The third layer 23 can be omitted in some cases.

The first layer 21 may be composed of a plurality of layers. The first layer 21 can be composed of a plurality of layers particularly when the first layer 21 is in contact with at least one of the impedance matching film 10 and the electrical conductor 30 in the form of a layer, as shown in FIG. 2B and FIG. 2C.

The first layer 21 may or may not have adhesiveness. When the first layer 21 has adhesiveness, an adhesive layer may be disposed in contact with at least one of the principal surfaces of the first layer 21 or may not be disposed in contact with either of the principal surfaces of the first layer 21. When the first layer 21 does not have adhesiveness, an adhesive layer is desirably disposed in contact with each of the principal surfaces of the first layer 21. When the dielectric layer 20 includes the second layer 22 which may not have adhesiveness, an adhesive layer may not be disposed in contact with both of the principal surfaces of the second layer 22. When the dielectric layer 20 includes the second layer 22 which may not have adhesiveness, an adhesive layer can be disposed in contact with one principal surface of the second layer 22. When the dielectric layer 20 includes the third layer 23 which may not have adhesiveness, an adhesive layer may not be disposed in contact with both of the principal surfaces of the third layer 23. An adhesive layer can be disposed in contact with at least one principal surface of the third layer 23.

The radio wave absorber 1a is designed to absorb a radio wave having a desired wavelength. The type of a radio wave the radio wave absorber 1a can absorb is not particularly limited. A radio wave capable of being absorbed by the radio wave absorber 1a can be, for example, a millimeter or submillimeter wave in a particular frequency range.

The radio wave absorber 1a may include at least one of a dielectric loss material and a magnetic loss material. In other words, the radio wave absorber 1a may be a dielectric loss-type radio wave absorber or a magnetic loss-type radio wave absorber. In this case, the sheet resistance required of the impedance matching film 10 tends to be high. The dielectric layer 20 may include at least one of a dielectric loss material and a magnetic loss material. The material of the impedance matching film 10 may be a magnetic substance.

The radio wave absorber 1a can be modified in various respects. For example, the radio wave absorber 1a may be modified to a radio wave absorber 1b shown in FIG. 3, a radio wave absorber 1c shown in FIG. 4A, or a radio wave absorber 1d shown in FIG. 5A. The radio wave absorbers 1b, 1c, and 1d are configured in the same manner as the radio wave absorber 1a unless otherwise described. The components of the radio wave absorbers 1b, 1c, and 1d that are the same as or correspond to the components of the radio wave absorber 1a are denoted by the same reference characters, and detailed descriptions of such components are omitted. The description given for the radio wave absorber 1a is applicable to the radio wave absorbers 1b, 1c, and 1d unless there is a technical inconsistency.

Figure 3:
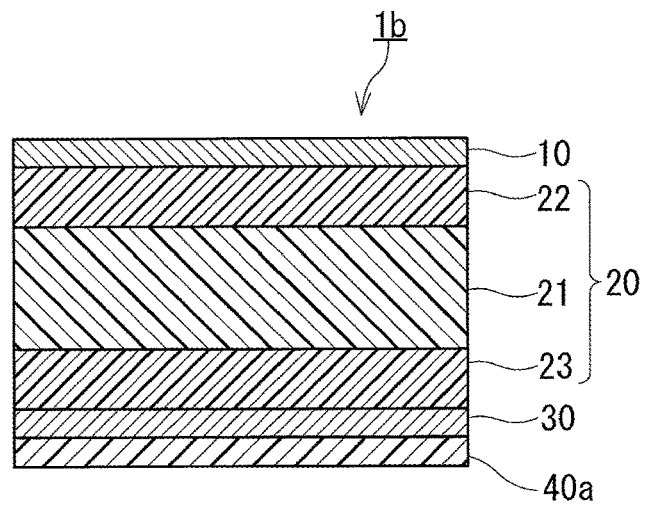
FIG. 3 is a cross-sectional view showing another example of the radio wave absorber according to the present invention.

As shown in FIG. 3, the radio wave absorber 1b further includes an adhesive layer 40a. In the radio wave absorber 1b, the electrical conductor 30 is disposed between the dielectric layer 20 and the adhesive layer 40a.

For example, the radio wave absorber 1b can be attached to a given article by bringing the adhesive layer 40a into contact with the article and pressing the radio wave absorber 1b to the article. A radio wave absorber-attached article can be obtained in this manner.

The adhesive layer 40a includes, for example, a rubber pressure-sensitive adhesive, an acrylic pressure-sensitive adhesive, a silicone pressure-sensitive adhesive, or a urethane pressure-sensitive adhesive. The radio wave absorber 1b may further include a separator (not illustrated). In this case, the separator covers the adhesive layer 40a. The separator is typically a film capable of maintaining the adhesiveness of the adhesive layer 40a while covering the adhesive layer 40a, the film being easily removable from the adhesive layer 40a. The separator is, for example, a film made of a polyester resin such as PET. Removal of the separator exposes the adhesive layer 40a and makes it possible to attach the radio wave absorber 1b to an article.

Figure 4A:
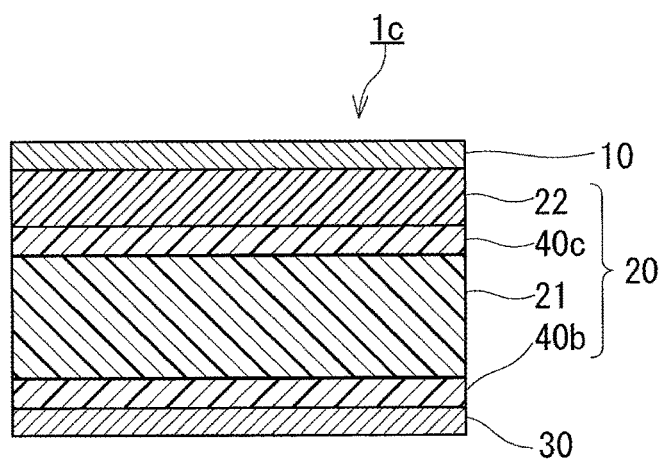
FIG. 4A is a cross-sectional view showing yet another example of the radio wave absorber according to the present invention.

In the radio wave absorber, the dielectric layer 20 may have adhesiveness to the electrical conductor 30. For example, as shown in FIG. 4A, the dielectric layer 20 of the radio wave absorber 1c has a plurality of layers including an adhesive layer 40b. The adhesive layer 40b is in contact with the electrical conductor 30. The adhesive layer 40b includes, for example, a rubber pressure-sensitive adhesive, an acrylic pressure-sensitive adhesive, a silicone pressure-sensitive adhesive, or a urethane pressure-sensitive adhesive. The adhesive layer 40b is disposed, for example, between the first layer 21 and the electrical conductor 30.

As shown in FIG. 4A, the dielectric layer 20 further includes an adhesive layer 40c. The adhesive layer 40c is, for example, in contact with the second layer 22. The radio wave absorber 1c may be modified in such a manner that the adhesive layer 40c is in contact with the impedance matching film 10. The adhesive layer 40c includes, for example, a rubber pressure-sensitive adhesive, an acrylic pressure-sensitive adhesive, a silicone pressure-sensitive adhesive, or a urethane pressure-sensitive adhesive. The adhesive layer 40c is disposed, for example, between the first layer 21 and the second layer 22.

Figure 4B:
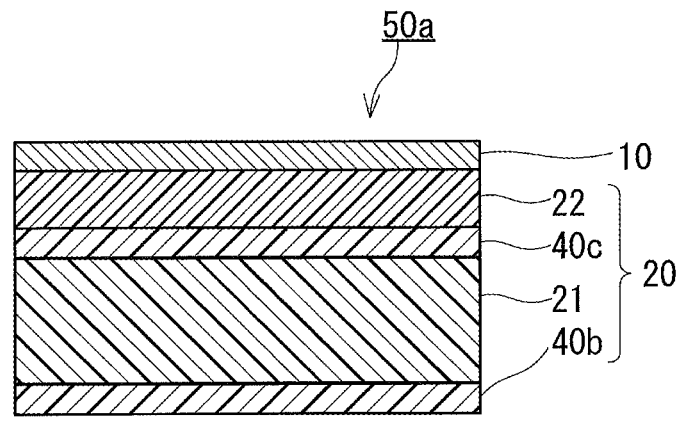
FIG. 4B is a cross-sectional view showing an example of a laminate for a radio wave absorber according to the present invention.

The radio wave absorber 1c can be produced, for example, using a laminate 50a for a radio wave absorber shown in FIG. 4B. The laminate 50a for a radio wave absorber includes the impedance matching film 10 and the dielectric layer 20. The dielectric layer 20 is disposed in contact with the impedance matching film 10 in the thickness direction of the impedance matching film 10.

In the laminate 50a for a radio wave absorber, for example, a principal surface of the dielectric layer 20 has adhesiveness, the principal surface being farther from the impedance matching film 10. In this case, for example, the radio wave absorber 1c can be produced by bringing the dielectric layer 20 into contact with the electrical conductor 30 and pressing the laminate 50a for a radio wave absorber to the electrical conductor 30 to attach the laminate 50a for a radio wave absorber to the electrical conductor 30.

As shown in FIG. 4B, the dielectric layer 20 of the laminate 50a for a radio wave absorber has, for example, a plurality of layers including the adhesive layer 40b. The adhesive layer 40b is disposed farthest from the impedance matching film 10 in the plurality of layers composing the dielectric layer 20.

The laminate 50a for a radio wave absorber may further include a separator (not illustrated). In this case, the separator covers the adhesive layer 40b. The separator is typically a film capable of maintaining the adhesiveness of the adhesive layer 40b while covering the adhesive layer 40b, the film being easily removable from the adhesive layer 40b. The separator is, for example, a film made of a polyester resin such as PET. Removal of the separator exposes the adhesive layer 40b and makes it possible to attach the laminate 50a for a radio wave absorber to the electrical conductor 30.

Figure 5A:
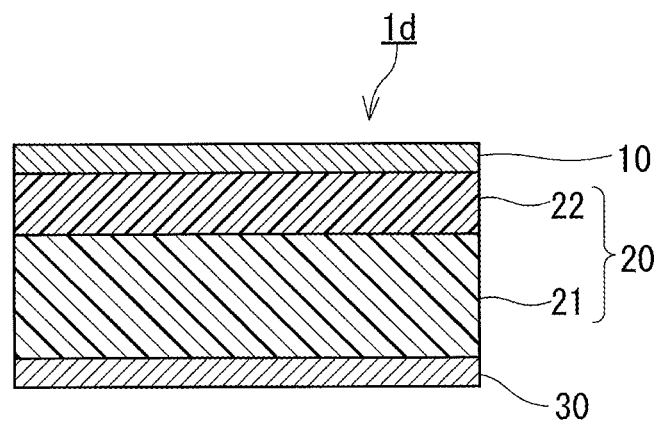
FIG. 5A is a cross-sectional view showing yet another example of the radio wave absorber according to the present invention.

As shown in FIG. 5A, in the radio wave absorber 1d, the first layer 21 is in contact with the electrical conductor 30. The first layer 21 has adhesiveness, for example, to the electrical conductor 30. The first layer 21 is, for example, in contact with the second layer 22. The first layer 21 has adhesiveness, for example, to the second layer 22. The radio wave absorber 1d may be modified in such a manner that the first layer 21 is in contact with the impedance matching film 10. In this case, the first layer 21 has adhesiveness, for example, to the impedance matching film 10.

Figure 5B:
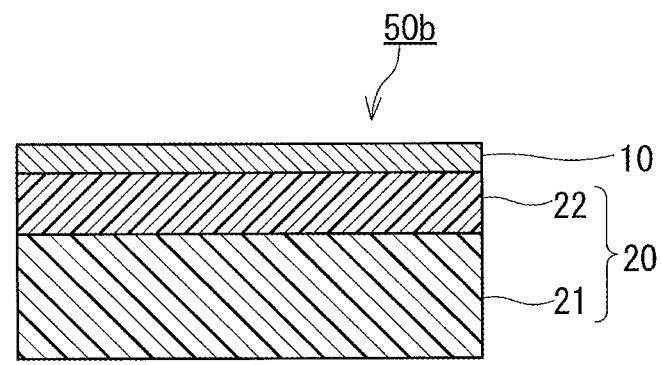
FIG. 5B is a cross-sectional view showing another example of the laminate for a radio wave absorber according to the present invention.

The radio wave absorber 1d can be produced, for example, using a laminate 50b for a radio wave absorber shown in FIG. 5B. The laminate 50b for a radio wave absorber includes the impedance matching film 10 and the dielectric layer 20. The dielectric layer 20 is disposed in contact with the impedance matching film 10 in the thickness direction of the impedance matching film 10.

In the laminate 50b for a radio wave absorber, a principal surface of the dielectric layer 20 has adhesiveness, the principal surface being farther from the impedance matching film 10. For example, the first layer 21 has adhesiveness. For example, the radio wave absorber 1d can be produced by bringing the first layer 21 into contact with the electrical conductor 30 and pressing the laminate 50b for a radio wave absorber to the electrical conductor 30 to attach the laminate 50b for a radio wave absorber to the electrical conductor 30.

The laminate 50b for a radio wave absorber may further include a separator (not illustrated). In this case, the separator covers the surface of the dielectric layer 20 to be in contact with the electrical conductor 30. The separator is typically a film capable of maintaining the adhesiveness of the surface of the dielectric layer 20 to be in contact with the electrical conductor 30 while covering the surface of the dielectric layer 20 to be in contact with the electrical conductor 30, the film being easily removable from the dielectric layer 20. The separator is, for example, a film made of a polyester resin such as PET. Removal of the separator exposes the surface of the dielectric layer 20 to be in contact with the electrical conductor 30 and makes it possible to attach the laminate 50*b* for a radio wave absorber to the electrical conductor 30.

The configuration of the laminate for a radio wave absorber is not limited to a particular configuration as long as the laminate for a radio wave absorber includes the impedance matching film 10 and the dielectric layer 20 and the dielectric layer 20 is disposed in contact with the impedance matching film 10 in the thickness direction of the impedance matching film 10.

EXAMPLES

The present invention will be described in more detail by examples. The present invention is not limited to the examples given below. First, methods for evaluation of Examples and Comparative Examples will be described.

[X-Ray Diffraction]

The thickness was measured for impedance matching films of impedance matching film-attached films according to Examples and Comparative Examples by X-ray reflectivity using an X-ray diffractometer (manufactured by Rigaku Corporation, product name: RINT2200). The results are shown in Table 1.

[TEM-EDX]

Specimens for TEM-EDX were produced from the impedance matching films according to Examples and Comparative Examples by a FIB microsampling technique using a focused ion beam (FIB) processing and observation system (FB-2200 manufactured by Hitachi High-Technologies Corporation). Each specimen had a thickness of 80 nm. A particular region on a cross-section of each specimen was subjected to EDX using a TEM-EDX system to examine the contents of elements in terms of the number of atoms. The results are shown in Table 1. The TEM-EDX system is composed of a combination of a TEM (manufactured by JEOL Ltd., product name: JEM-2800) and an EDX system (manufactured by Thermo Fisher Scientific K.K., product name: NORAN System 7). The region subjected to EDX has a length of 400 nm in the direction perpendicular to the thickness direction of the impedance matching film at the center in the thickness direction of the impedance matching film.

[Specific Resistance]

Initial sheet resistances Ri [Ω/□] of the impedance matching films according to Examples and Comparative Examples were measured by an eddy current method according to JIS Z 2316 using a non-contact resistance measurement apparatus (manufactured by NAPSON CORPORATION, product name: NC-80MAP). In each of Examples and Comparative Examples, a product of the thickness of the impedance matching film measured as described above and the initial sheet resistance Ri [Ω/□] of the impedance matching film measured as described above was calculated to determine the specific resistance of the impedance matching film. The results are shown in Table 1.

[Heating Test]

The impedance matching film-attached films according to Examples and Comparative Examples were exposed to an environment at 80° C. for 24 hours. After that, sheet resistances Rt [Ω/□] of the impedance matching films according to Examples and Comparative Examples having undergone the heating test were measured by an eddy current method according to JIS Z 2316 using a non-contact resistance measurement apparatus (manufactured by NAPSON CORPORATION, product name: NC-80MAP). From the results for this measurement and the initial sheet resistances Ri [Ω/□] measured as described above for the impedance matching films, sheet resistance change rates Cs of the impedance matching films according to Examples were determined by the above equation (1). The results are shown in Table 1.

[Radio Wave Absorption Performance]

By reference to JIS R 1679: 2007, a radio wave with a frequency of 60 to 90 GHz was allowed to incident at an incident angle of 0° on samples according to Examples and Comparative Examples each fixed to a sample holder, and a return loss at each frequency was determined using a vector network analyzer manufactured by ANRITSU CORPORATION. The return loss is the absolute value |S| of a value calculated by the following equation (3). In the equation (3), $P_O$ represents the electric power of a transmitted radio wave at the time of incidence of a radio wave on an object to be measured at a given incident angle, and $P_i$ represents the electric power of a received radio wave obtained at the same time. It should be noted that a return loss |S| obtained by making a radio wave perpendicularly incident on an aluminum plate, instead of the samples according to Examples and Comparative Examples, fixed to a sample holder was regarded as 0 dB and was employed as a benchmark of the return losses |S| of the samples. The plate had surface dimensions of 30 cm square and had a thickness of 5 mm. The largest value of the return loss |S| and a frequency (absorption peak frequency) at which the largest value was obtained were determined for each sample. Table 2 shows the results. A sample whose largest value of the return loss |S| is 10 dB or more can be evaluated as having good radio wave absorption performance.

$$S[dB] = 10 \times \log |P_i/P_0| \qquad \text{Equation (3)}$$

Example 1

An impedance matching film according to Example 1 was formed on a 23-μm-thick PET film by performing sputtering using a target material including Cr (chromium), Ti (titanium), and O (oxygen) with argon gas supplied around the PET film. An impedance matching film-attached film according to Example 1 was obtained in this manner.

An acrylic resin having a relative permittivity of 2.6 was shaped to a thickness of 560 μm to obtain an acrylic resin layer. The impedance matching film-attached film according to Example 1 was placed on the acrylic resin layer in such a manner that the impedance matching film of the impedance matching film-attached film according to Example 1 was in contact with the acrylic resin layer. Next, a reflector-attached film in which a PET layer was arranged on each surface of a 7-μm-thick Al (aluminum) film was obtained. In this reflector-attached film, the PET layer arranged on one of the principal surfaces of the aluminum film had a thickness of 25 μm, and the PET layer arranged on the other principal surface of the aluminum film had a thickness of 9 μm. The reflector-attached film was placed on the acrylic resin layer in such a manner that the 25 μm-thick PET layer of the reflector-attached film was in contact with the acrylic resin layer. A sample according to Example 1 was obtained in this manner.

Example 2

An impedance matching film according to Example 2 was formed on a 23-μm-thick PET film by performing sputtering using a target material composed of Cr (chromium) with argon gas and nitrogen gas supplied around the PET film. An impedance matching film-attached film according to Example 2 was obtained in this manner. It is inferred that introduction of a small amount of residual oxygen into a chamber during the sputtering led to detection of oxygen in the impedance matching film according to Example 2.

A sample according to Example 2 was produced in the same manner as in Example 1, except that the impedance matching film according to Example 2 was used instead of the impedance matching film according to Example 1.

Example 3

An impedance matching film according to Example 3 was formed on a 23-μm-thick PET film by performing sputtering using a target material composed of HASTELLOY C-276 with argon gas and nitrogen gas supplied around the PET film. An impedance matching film-attached film according to Example 3 was obtained in this manner. HASTELLOY is a registered trademark of Haynes International, Inc. It is inferred that introduction of a small amount of residual oxygen into a chamber during the sputtering led to detection of oxygen in the impedance matching film according to Example 3.

A sample according to Example 3 was produced in the same manner as in Example 1, except that the impedance matching film according to Example 3 was used instead of the impedance matching film according to Example 1.

Example 4

An impedance matching film according to Example 4 was formed on a 23-μm-thick PET film by performing sputtering using a target material composed of Cu (copper), Ni (nickel), and Si (silicon) with argon gas supplied around the PET film.

A sample according to Example 4 was produced in the same manner as in Example 1, except that the impedance matching film according to Example 4 was used instead of the impedance matching film according to Example 1.

Example 5

An impedance matching film according to Example 5 was formed on a 23-μm-thick PET film by performing sputtering using a target material composed of Cu (copper), Ni (nickel), and Si (silicon) with argon gas supplied around the PET film.

A sample according to Example 5 was produced in the same manner as in Example 1, except that the impedance matching film according to Example 5 was used instead of the impedance matching film according to Example 1.

Example 6

An impedance matching film according to Example 6 was formed on a 23-μm-thick PET film by performing sputtering using a target material composed of Cu (copper), Ti (titanium), and Si (silicon) with argon gas supplied around the PET film.

A sample according to Example 6 was produced in the same manner as in Example 1, except that the impedance matching film according to Example 6 was used instead of the impedance matching film according to Example 1.

Example 7

An impedance matching film according to Example 7 was formed on a 23-μm-thick PET film by performing sputtering using a target material composed of Cu (copper), Ti (titanium), and Si (silicon) with argon gas supplied around the PET film.

A sample according to Example 7 was produced in the same manner as in Example 1, except that the impedance matching film according to Example 7 was used instead of the impedance matching film according to Example 1.

Example 8

An impedance matching film according to Example 8 was formed on a 23-μm-thick PET film by performing sputtering using a target material composed of Ti (titanium) and Mo (molybdenum) with argon gas and nitrogen gas supplied around the PET film. It is inferred that introduction of a small amount of residual oxygen into a chamber during the sputtering led to detection of oxygen in the impedance matching film according to Example 8.

A sample according to Example 8 was produced in the same manner as in Example 1, except that the impedance matching film according to Example 8 was used instead of the impedance matching film according to Example 1.

Example 9

An impedance matching film according to Example 9 was formed on a 23-μm-thick PET film by performing sputtering using a target material composed of Ti (titanium) and Mo (molybdenum) with argon gas and nitrogen gas supplied around the PET film. It is inferred that introduction of a small amount of residual oxygen into a chamber during the sputtering led to detection of oxygen in the impedance matching film according to Example 9.

A sample according to Example 9 was produced in the same manner as in Example 1, except that the impedance matching film according to Example 9 was used instead of the impedance matching film according to Example 1.

Example 10

An impedance matching film according to Example 10 was formed on a 23-μm-thick PET film by performing sputtering using a target material composed of Ti (titanium) and Mo (molybdenum) with argon gas and nitrogen gas supplied around the PET film. It is inferred that introduction of a small amount of residual oxygen into a chamber during the sputtering led to detection of oxygen in the impedance matching film according to Example 10.

A sample according to Example 10 was produced in the same manner as in Example 1, except that the impedance matching film according to Example 10 was used instead of the impedance matching film according to Example 1.

Comparative Example 1

An impedance matching film according to Comparative Example 1 was formed on a 23-μm-thick PET film by performing sputtering using a target material composed of Fe (iron), Cr (chromium), and Ni (nickel) with argon gas supplied around the PET film. An impedance matching film-attached film according to Comparative Example 1 was obtained in this manner.

A sample according to Comparative Example 1 was produced in the same manner as in Example 1, except that the impedance matching film according to Comparative Example 1 was used instead of the impedance matching film according to Example 1.

Comparative Example 2

An impedance matching film according to Comparative Example 2 was formed on a 23-μm-thick PET film by performing sputtering using a target material composed of Ti (titanium) and Mo (molybdenum) with argon gas supplied around the PET film. It is inferred that introduction of small amounts of residual nitrogen and residual oxygen into a chamber during the sputtering led to detection of nitrogen and oxygen in the impedance matching film according to Comparative Example 2.

A sample according to Comparative Example 2 was produced in the same manner as in Example 1, except that the impedance matching film according to Comparative Example 2 was used instead of the impedance matching film according to Example 1.

As shown in Table 1, the impedance matching films according to Examples 1 to 10 had a sheet resistance change rate Cs of 20% or less. On the other hand, the impedance matching films according to Comparative Examples 1 and 2 had a sheet resistance change rate Cs of 63% and 59%, respectively. This indicates that the sheet resistances of the impedance matching films according to Examples 1 to 10 are less likely to change when the impedance matching films are exposed to a high-temperature environment.

As shown in Table 2, the samples according to Examples 1 to 10 were able to exhibit good radio wave absorption performance.

TABLE 2

| | Evaluation of radio wave absorber | |
|---|---|---|
| | Absorption peak frequency [GHz] | Largest value of return loss [dB] |
| Example 1 | 77 | 41 |
| Example 2 | 77 | 22 |
| Example 3 | 77 | 18 |

TABLE 2-continued

| | Evaluation of radio wave absorber | |
|---|---|---|
| | Absorption peak frequency [GHz] | Largest value of return loss [dB] |
| Example 4 | 77 | 40 |
| Example 5 | 77 | 25 |
| Example 6 | 77 | 25 |
| Example 7 | 77 | 23 |
| Example 8 | 77 | 41 |
| Example 9 | 77 | 51 |
| Example 10 | 77 | 11 |
| Comparative Example 1 | 77 | 23 |
| Comparative Example 2 | 77 | 48 |

The invention claimed is:

1. An impedance matching film for a radio wave absorber, comprising:
   a metallic element; and
   a non-metallic element, wherein
   the impedance matching film is a singular layer made of a mixture containing the metallic element and the non-metallic element,

TABLE 1

| | | Example 1 | Example 2 | Example 3 | Example 4 | Example 5 | Example 6 | Example 7 | Example 8 | Example 9 | Example 10 | Comp. Example 1 | Comp. Example 2 |
|---|---|---|---|---|---|---|---|---|---|---|---|---|---|
| Content of metallic element [at %] | Cr | 66 | 50 | 11 | 0 | 0 | 0 | 0 | 0 | 0 | 0 | 19 | 0 |
| | Ti | 7 | 0 | 0 | 0 | 0 | 10 | 17 | 40 | 42 | 44 | 0 | 72 |
| | Ni | 0 | 0 | 48 | 12 | 19 | 0 | 0 | 0 | 0 | 0 | 9 | 0 |
| | Fe | 0 | 0 | 5 | 0 | 0 | 0 | 0 | 0 | 0 | 0 | 72 | 0 |
| | Mo | 0 | 0 | 10 | 0 | 0 | 0 | 0 | 5 | 6 | 6 | 0 | 15 |
| | W | 0 | 0 | 2 | 0 | 0 | 0 | 0 | 0 | 0 | 0 | 0 | 0 |
| | Cu | 0 | 0 | 0 | 38 | 30 | 24 | 16 | 0 | 0 | 0 | 0 | 0 |
| | Total | 73 | 50 | 76 | 50 | 49 | 34 | 33 | 45 | 48 | 50 | 100 | 87 |
| Total content of Ni, Cr, Ti, and Mo [at %] | | 73 | 50 | 69 | 12 | 19 | 10 | 17 | 45 | 48 | 50 | 28 | 87 |
| Content of non-metallic element [at %] | O | 27 | 15 | 6 | 0 | 0 | 0 | 0 | 22 | 11 | 12 | 0 | 0 |
| | N | 0 | 35 | 18 | 0 | 0 | 0 | 0 | 33 | 41 | 38 | 0 | 1 |
| | Si | 0 | 0 | 0 | 50 | 51 | 66 | 67 | 0 | 0 | 0 | 0 | 12 |
| | Total | 27 | 50 | 24 | 50 | 51 | 66 | 67 | 55 | 52 | 50 | 0 | 13 |
| Specific resistance [Ω · cm] | | $1.2 \times 10^{-3}$ | $2.4 \times 10^{-3}$ | $4.2 \times 10^{-4}$ | $5.8 \times 10^{-4}$ | $8.8 \times 10^{-4}$ | $1.1 \times 10^{-3}$ | $8.8 \times 10^{-4}$ | $1.7 \times 10^{-3}$ | $1.2 \times 10^{-3}$ | $6.7 \times 10^{-4}$ | $1.9 \times 10^{-4}$ | $2.3 \times 10^{-4}$ |
| Thickness [nm] | | 31.0 | 68.4 | 13.9 | 15.2 | 24.0 | 30.1 | 25.1 | 50 | 17 | 30 | 4 | 5.6 |
| Initial sheet resistance Ri [Ω/□] | | 387 | 354 | 303 | 381 | 367 | 366 | 350 | 387 | 413 | 222 | 468 | 410 |
| Sheet resistance change rate Cs [%] | | 0 | 2 | 2 | 0 | 3 | 4 | 3 | 19 | 2 | 2 | 63 | 59 | the impedance matching film has a thickness of 10 to 200 nm, the impedance matching film has a sheet resistance of 200 Ω/□ or more, a content of an oxygen atom is less than 50% in terms of the number of atoms, the metallic element is at least one element selected from the group consisting of Ni, Cr, Mo, and Ti, and a total content of Ni, Cr, Mo, and Ti is 10% or more in terms of the number of atoms.

2. The impedance matching film for a radio wave absorber according to claim 1, wherein the impedance matching film has a specific resistance of $0.4 \times 10^{-3}$ Ω·cm or more.

3. The impedance matching film for a radio wave absorber according to claim 1, wherein the non-metallic element is at least one element selected from the group consisting of B, C, N, O, F, Si, S, and Ge.

4. The impedance matching film for a radio wave absorber according to claim 1, wherein the metallic element is at least one element selected from the group consisting of Ni, Cr, Ti, W, Mo, Cu, Al, Sn, Pd, Ta, Rh, Au, Mg, Fe, Mn, Co, and V.

5. The impedance matching film for a radio wave absorber according to claim 1, wherein the impedance matching film has a sheet resistance of 600 Ω/☐ or less.

6. The impedance matching film for a radio wave absorber according to claim 1, wherein the impedance matching film has a specific resistance of $8.0 \times 10^{-3}$ Ω·cm or less.

7. An impedance matching film-attached film for a radio wave absorber, comprising:

a substrate; and the impedance matching film for a radio wave absorber according to claim 1.

8. A radio wave absorber comprising:

the impedance matching film for a radio wave absorber according to claim 1;

an electrical conductor that reflects a radio wave; and a dielectric layer disposed between the impedance matching film and the electrical conductor in a thickness direction of the impedance matching film.

9. A laminate for a radio wave absorber, comprising:

the impedance matching film for a radio wave absorber according to claim 1; and a dielectric layer disposed in contact with the impedance matching film in a thickness direction of the impedance matching film.

* * * * *